(12) United States Patent
Guo

(10) Patent No.: US 11,280,843 B2
(45) Date of Patent: Mar. 22, 2022

(54) METHOD OF DETERMINING AN AGING LEVEL OF A BATTERY

(71) Applicant: Simplo Technology Co., Ltd., Hsinchu County (TW)

(72) Inventor: Yi-Ren Guo, Kaohsiung (TW)

(73) Assignee: Simplo Technology Co., Ltd., Hsinchu County (TW)

(*) Notice: Subject to any disclaimer, the term of this patent is extended or adjusted under 35 U.S.C. 154(b) by 0 days.

(21) Appl. No.: 17/140,112

(22) Filed: Jan. 3, 2021

(65) Prior Publication Data

US 2021/0293891 A1 Sep. 23, 2021

(30) Foreign Application Priority Data

Mar. 19, 2020 (TW) .................................. 109109199

(51) Int. Cl.
*G01R 31/382* (2019.01)
*H01M 10/48* (2006.01)
*G01R 31/392* (2019.01)

(52) U.S. Cl.
CPC ......... *G01R 31/392* (2019.01); *G01R 31/382* (2019.01); *H01M 10/48* (2013.01)

(58) Field of Classification Search
CPC .............. G01R 31/3835; G01R 31/367; G01R 31/382; G01R 31/3648; B60L 58/12; H01M 10/482; H01M 2010/4271; H01M 2220/20; Y02T 10/7044; Y02T 10/7005; Y02T 10/705

USPC ..... 324/132, 415, 437, 425–433, 76.11, 126, 324/756.05, 538, 200, 207.13, 233, 256, 324/515, 500–530, 750.06
See application file for complete search history.

(56) References Cited

U.S. PATENT DOCUMENTS

| 2004/0128089 A1* | 7/2004 | Barsoukov | ........... G01R 31/389 702/65 |
| 2014/0269811 A1* | 9/2014 | Maleki | ................... G01K 13/00 374/1 |

* cited by examiner

*Primary Examiner* — Vincent Q Nguyen
*Assistant Examiner* — Trung Q Nguyen
(74) *Attorney, Agent, or Firm* — Winston Hsu

(57) ABSTRACT

A method of determining an aging level of a battery includes utilizing a first charging device to charge a first battery; utilizing a second obtaining device to obtain a plurality of first steady open-circuit voltages (OCVs) of the first battery when a charging state of the first battery respectively reaches a plurality of first stop-charge conditions; utilizing a second charging device to charge a second battery; utilizing a third obtaining device to obtain a stop-charge parameter of the second battery and a second steady OCV of the second battery corresponding to the stop-charge parameter of the second battery; and utilizing an aging level determining device to determine an aging level of the second battery relative to the first battery according to the second steady OCV of the second battery and one of the first steady OCVs of the first battery corresponding to the stop-charge parameter of the second battery.

12 Claims, 7 Drawing Sheets

METHOD OF DETERMINING AN AGING LEVEL OF A BATTERY

BACKGROUND OF THE INVENTION

1. Field of the Invention

The present invention relates to a method of determining an aging level of a battery, and a method of determining an aging level of a battery which consumes less time.

2. Description of the Prior Art

With advancement of the technology and development of the society, electric energy has gradually become the mainstream energy source. Energy storage devices that can store electric energy are widely used in different equipment. Lithium batteries are one of the most common energy storage devices. An available capacity of the Lithium battery reduces along with increase of charging/discharging cycles. Therefore, currently, it is a common way to determine an aging level of the Lithium battery according to the current available capacity of the Lithium battery. In order to acquire the current available capacity of the Lithium battery, it has to drain the Lithium battery by a specific current. This method can determine the aging level of the Lithium battery precisely but consumes a lot of time. Also, there is an indirect way to determine the aging level of the Lithium battery according to an internal resistance of the Lithium battery. However, it also consumes a lot of time to acquire a relation of the internal resistance and the aging level of the Lithium battery. Therefore, it becomes an important topic to determine an aging level of a battery in a short time.

SUMMARY OF THE INVENTION

Therefore, it is an objective of the present invention to provide a method of determining an aging level of a battery, and a method of determining an aging level of a battery which consumes less time.

In order to achieve the aforementioned objective, the present invention discloses a method of determining an aging level of a battery. The method includes utilizing a first charging device to charge a first battery; utilizing a second obtaining device to obtain a plurality of first steady open-circuit voltages of the first battery when a charging state of the first battery respectively reaches a plurality of first stop-charge conditions; utilizing a second charging device to charge a second battery; utilizing a third obtaining device to obtain a stop-charge parameter of the second battery and a second steady open-circuit voltage of the second battery corresponding to the stop-charge parameter of the second battery; and utilizing an aging level determining device to determine an aging level of the second battery relative to the first battery according to the second steady open-circuit voltage of the second battery and one of the plurality of first steady open-circuit voltages of the first battery corresponding to the stop-charge parameter of the second battery. The aging level determining device determines the aging level of the second battery relative to the first battery by comparing the second steady open-circuit voltage of the second battery with the one of the plurality of first steady open-circuit voltages of the first battery corresponding to the stop-charge parameter of the second battery.

In summary, in the present invention, when it is desired to determine the aging level of the second battery relative to the first battery, it can obtain the plurality of first steady open-circuit voltages of the first battery when the charging state of the first battery reaches a plurality of first stop-charge conditions respectively and then can obtain a stop-charge parameter of the second battery and a second steady open-circuit voltage of the second battery corresponding to the stop-charge parameter of the second battery. Afterwards, the aging level of the second battery relative to the first battery can be determined according to the second steady open-circuit voltage of the second battery and the one of the plurality of first steady open-circuit voltages of the first battery corresponding to the stop-charge parameter of the second battery. The present invention requires neither draining of a battery nor a relation of an internal resistance and an aging level of the battery. Therefore, the method of determining an aging level of a battery of the present invention consumes less time.

These and other objectives of the present invention will no doubt become obvious to those of ordinary skill in the art after reading the following detailed description of the preferred embodiment that is illustrated in the various figures and drawings.

DETAILED DESCRIPTION

The term "connect" is intended to mean either an indirect or direct electrical/mechanical connection. Thus, if a first device is connected to a second device, that connection may be through a direct electrical/mechanical connection, or through an indirect electrical/mechanical connection via other devices and connections.

Figure 1:
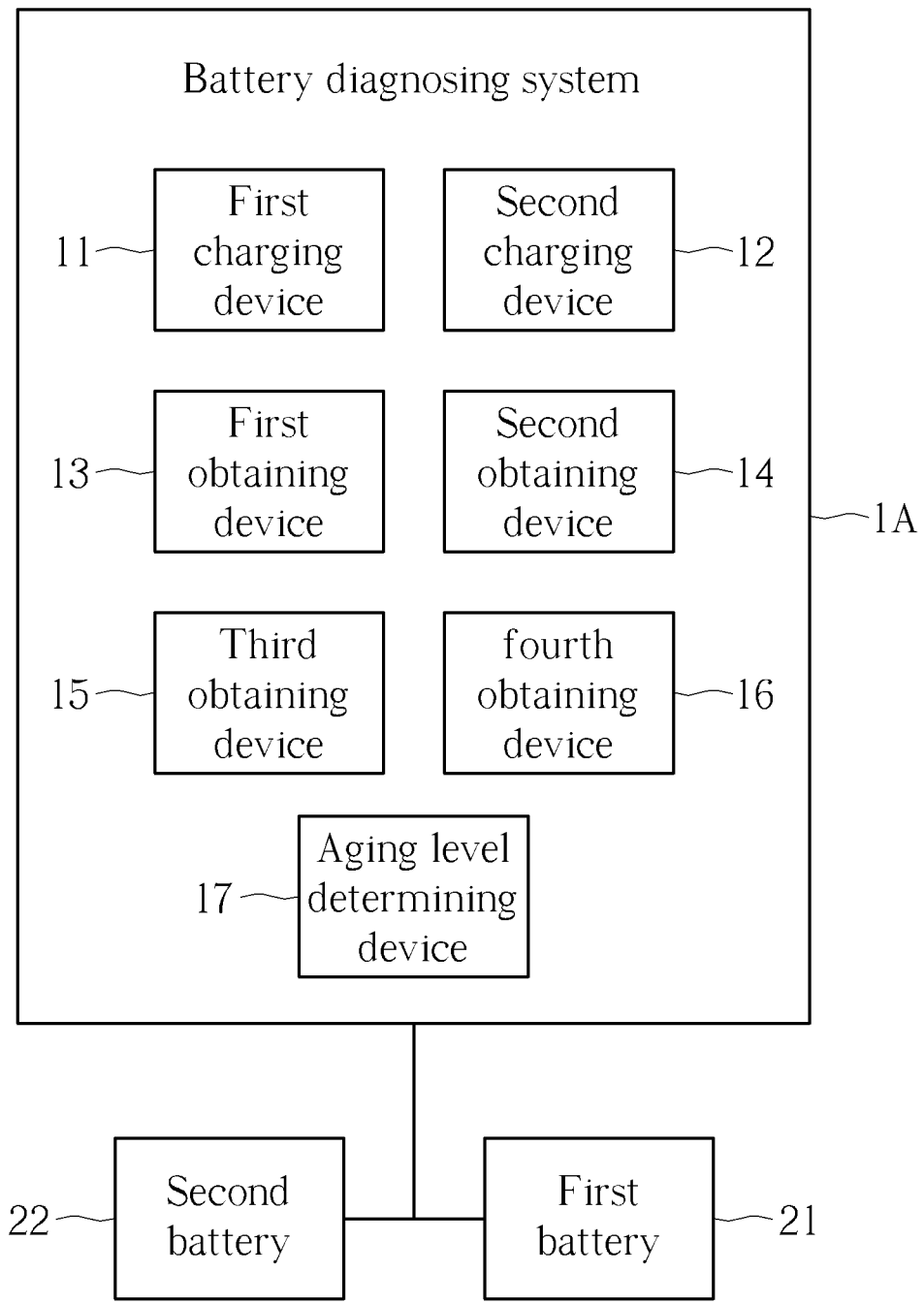
FIG. 1 is a functional block diagram of a battery diagnosing system according to a first embodiment of the present invention.
Figure 2:
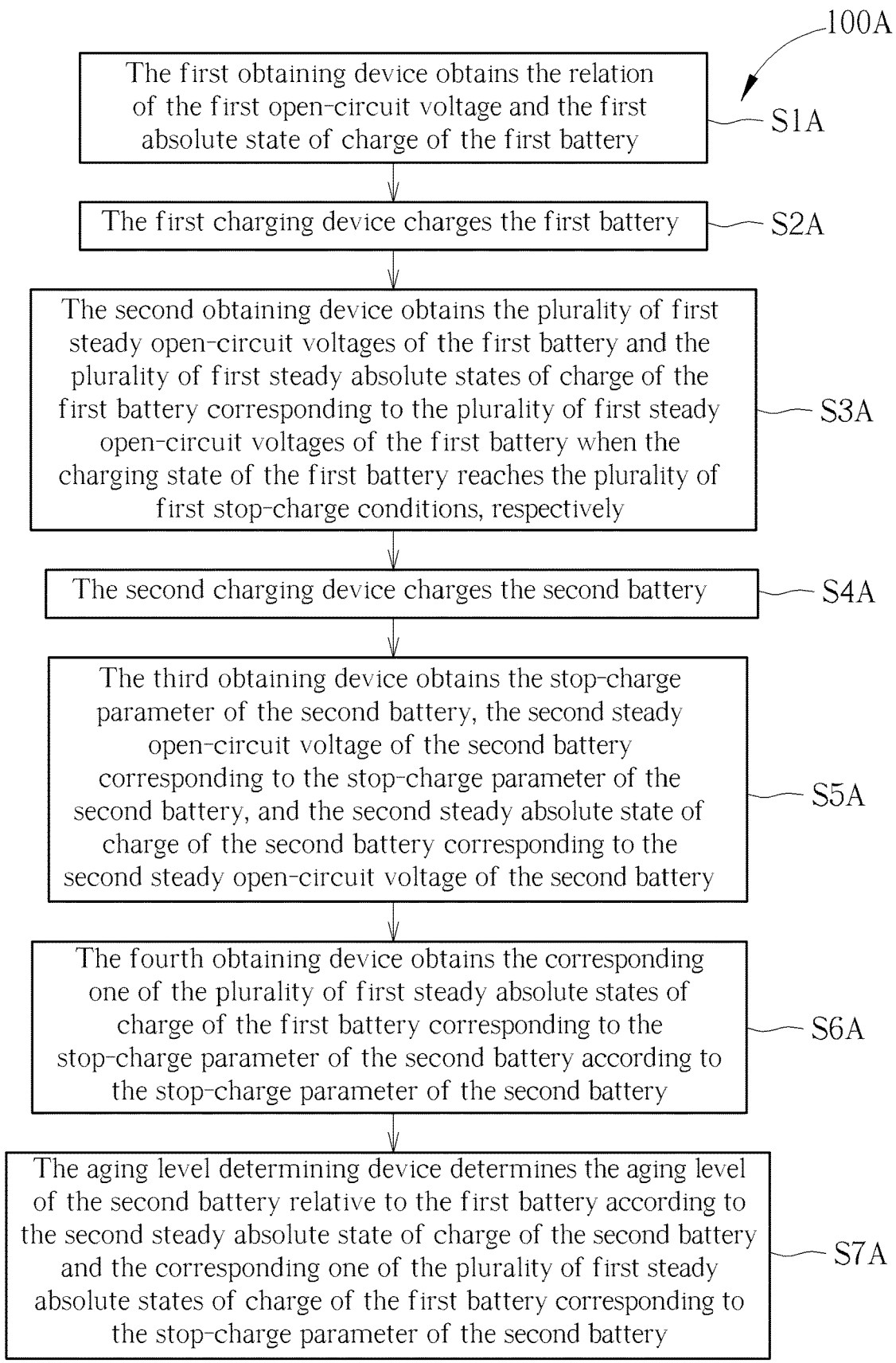
FIG. 2 is a flow chart diagram of a method of determining an aging level of a battery executed by the battery diagnosing system according to the first embodiment of the present invention.
Figure 3:
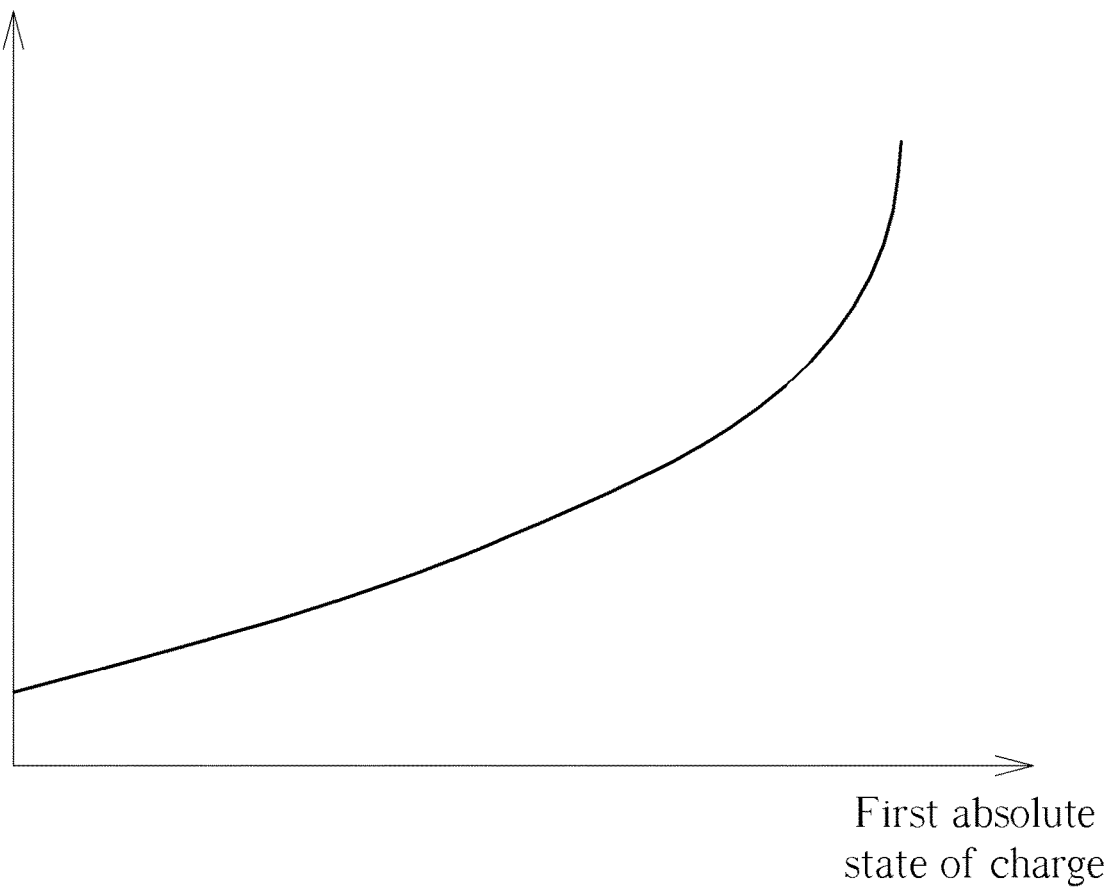
FIG. 3 is a diagram illustrating a relation of a first open-circuit voltage and a first absolute state of charge of a first battery according to the first embodiment of the present invention.

Please refer to FIG. 1 to FIG. 3. FIG. 1 is a functional block diagram of a battery diagnosing system 1A according to a first embodiment of the present invention. FIG. 2 is a flow chart diagram of a method 100A of determining an aging level of a battery executed by the battery diagnosing system 1A according to the first embodiment of the present invention. FIG. 3 is a diagram illustrating a relation of a first open-circuit voltage and a first absolute state of charge of a first battery 21 according to the first embodiment of the present invention. As shown in FIG. 1 and FIG. 2, the battery diagnosing system 1A includes a first charging device 11, a second charging device 12, a first obtaining device 13, a second obtaining device 14, a third obtaining device 15, a fourth obtaining device 16 and an aging level determining device 17. The first charging device 11, the second charging device 12, the first obtaining device 13, the second obtaining device 14, the third obtaining device 15, the fourth obtaining device 16 and the aging level determining device 17 are connected to one another via a direct connection or an indirect connection for transmission of signals, data and/or power. The first charging device 11 is configured to charge the first battery 21. The second charging device 12 is configured to charge a second battery 22 which has the same chemistry as the first battery 21 does. The first obtaining device 13 is configured to obtain the relation of the first open-circuit voltage and the first absolute state of charge of the first battery 21. The second obtaining device 14 is configured to obtain a plurality of first steady open-circuit voltages of the first battery 21 and a plurality of first steady absolute states of charge of the first battery 21 corresponding to the plurality of first steady open-circuit voltages of the first battery 21 when a charging state of the first battery 21 reaches a plurality of first stop-charge conditions, respectively. The third obtaining device 15 is configured to obtain a stop-charge parameter of the second battery 22 and a second steady open-circuit voltage of the second battery 22 corresponding to the stop-charge parameter of the second battery 22. The fourth obtaining device 16 is configured to obtain a corresponding one of the plurality of first steady absolute states of charge of the first battery 21 corresponding to the stop-charge parameter of the second battery 22 according to the stop-charge parameter of the second battery 22. The aging level determining device 17 is configured to determine an aging level of the second battery 22 relative to the first battery 21 according to the second steady open-circuit voltage of the second battery 22 and a corresponding one of the plurality of first steady open-circuit voltages of the first battery 21 corresponding to the stop-charge parameter of the second battery 22.

As shown in FIG. 2, the method 100A of determining the aging level of the battery includes following steps:

S1A: The first obtaining device 13 obtains the relation of the first open-circuit voltage and the first absolute state of charge of the first battery 21.

S2A: The first charging device 11 charges the first battery 21.

S3A: The second obtaining device 14 obtains the plurality of first steady open-circuit voltages of the first battery 21 and the plurality of first steady absolute states of charge of the first battery 21 corresponding to the plurality of first steady open-circuit voltages of the first battery 21 when the charging state of the first battery 21 reaches the plurality of first stop-charge conditions, respectively.

S4A: The second charging device 12 charges the second battery 22.

S5A: The third obtaining device 15 obtains the stop-charge parameter of the second battery 22, the second steady open-circuit voltage of the second battery 22 corresponding to the stop-charge parameter of the second battery 22, and the second steady absolute state of charge of the second battery 22 corresponding to the second steady open-circuit voltage of the second battery 22.

S6A: The fourth obtaining device 16 obtains the corresponding one of the plurality of first steady absolute states of charge of the first battery 21 corresponding to the stop-charge parameter of the second battery 22 according to the stop-charge parameter of the second battery 22.

S7A: The aging level determining device 17 determines the aging level of the second battery 22 relative to the first battery 21 according to the second steady absolute state of charge of the second battery 22 and the corresponding one of the plurality of first steady absolute states of charge of the first battery 21 corresponding to the stop-charge parameter of the second battery 22.

Detailed description for the steps is provided as follows. In steps S1A to S3A, when it is desired to obtain the aging level of the second battery 22 relative to the first battery 21, the battery diagnosing system 1A can charge and discharge the first battery 21 by an extremely low current to obtain the relation of the first open-circuit voltage and the first absolute state of charge of the first battery 21 with the first obtaining device 13, wherein a curve of the relation of the first open-circuit voltage and the first absolute state of charge of the first battery 21 is shown in FIG. 3. However, the present invention is not limited to this embodiment. For example, in another embodiment, if the relation of the first open-circuit voltage and the first absolute state of charge of the first battery is known in advance, step S1A and the first obtaining device 13 of the first embodiment can be omitted. After the relation of the first open-circuit voltage and the first absolute state of charge of the first battery 21 is obtained, the first charging device 11 of the battery diagnosing system 1A can charge the first battery 21 and then stop charging the first battery 21 when the charging state of the first battery 21 reaches the plurality of first stop-charge conditions respectively, so that the second obtaining device 14 can obtain the plurality of first steady open-circuit voltages of the first battery 21 and the plurality of first steady absolute states of charge of the first battery 21 corresponding to the plurality of first steady open-circuit voltages of the first battery 21 when the charging state of the first battery 21 reaches the plurality of first stop-charge conditions, respectively.

Specifically, taking following Table 1 as an example, after the first obtaining device 13 obtains the relation of the first open-circuit voltage and the first absolute state of charge of the first battery 21, the first charging device 11 can charge the first battery 21, and the plurality of first stop-charge conditions can correspond to a plurality of first stop-charge currents of the first battery 21 in a first constant voltage charging mode. In this embodiment, a charging voltage of the first battery 21 in the first constant voltage charging mode can be 4.4 V, and the plurality of first stop-charge conditions can correspond to 1000, 900, 800, 700, 600, 500, 400 and 337 mA. More specifically, for example, when a charging current of the first battery 21 in the first constant voltage charging mode decreases to 1000 mA, the first charging device 11 stop charging the first battery 21. Afterwards, the first battery 21 can stand for a while to be in a first steady state, i.e., the voltage of the first battery 21 does not change anymore. At this moment, the second obtaining device 14 can measure the corresponding first steady open-circuit voltage to obtain that the corresponding first steady open-circuit voltage is 4347 mA. Similarly, the first charging device 11 can stop charging the first battery 21 when the charging current of the first battery 21 in the first constant voltage charging mode decreases to 900, 800, 700, 600, 500, 400 and 337 mA, so that the second obtaining device 14 can measure the corresponding first steady open-circuit voltages corresponding to the first stop-charge conditions of 900, 800, 700, 600, 500, 400 and 337 mA to obtain that the corresponding first steady open-circuit voltages corresponding to the first stop-charge conditions of 900, 800, 700, 600, 500, 400 and 337 mA are 4357, 4365, 4372, 4379, 4387, 4395 and 4400 mV, respectively. After obtaining the first steady open-circuit voltages, the second obtaining device 14 can further obtain that a plurality of first steady absolute states of charge of the first battery 21 corresponding to the plurality of first steady open-circuit voltages of the first battery can be 95.5, 96.417, 97.176, 97.805, 98.443, 99.051, 99.614 and 100% by looking up the relation of the first open-circuit voltage and the first absolute state of charge of the first battery 21, which is shown in FIG. 3, with interpolation.

TABLE 1

| Charging voltage of first battery (V) | Charging current of first battery (mA) | First steady open-circuit voltage of first battery (mV) | First steady absolute state of charge of first battery (%) |
|---|---|---|---|
| 4.4 | 1000 | 4347 | 95.5 |
| 4.4 | 900 | 4357 | 96.417 |
| 4.4 | 800 | 4365 | 97.176 |
| 4.4 | 700 | 4372 | 97.805 |
| 4.4 | 600 | 4379 | 98.443 |
| 4.4 | 500 | 4387 | 99.051 |
| 4.4 | 400 | 4395 | 99.614 |
| 4.4 | 337 | 4400 | 100 |

Besides, in steps S4A and S5A, the second charging device 12 of the battery diagnosing system 1A can charge the second battery 22, and the third obtaining device 15 can obtain the stop-charge parameter of the second battery 22, the second steady open-circuit voltage of the second battery 22 corresponding to the stop-charge parameter of the second battery 22 and the second steady absolute state of charge of the second battery 22 corresponding to the second steady open-circuit voltage.

Specifically, taking following Table 2 as an example, the second charging device 12 can charge the second battery 22 and then stop charging the second battery 22 after the second battery 22 is charged for a while to be in a second constant voltage charging mode. Preferably, in this embodiment, a charging voltage of the second battery 22 in the second constant voltage charging mode can be 4.4 V which is the same as the charging voltage of the first battery 21 in the first constant voltage charging mode. At this moment, the third obtaining device 15 can measure a stop-charge current of the second battery 22 just before the second charging device 12 stops charging the second battery 22 to obtain that the stop-charge current of the second battery 22 just before the second charging device 12 stops charging the second battery 22 can be 344 mA. In other words, the stop-charge parameter of this embodiment can be the stop-charge current of the second battery 22 in the second constant voltage charging mode. Afterwards, the second battery 22 can stand for a while to be in a second steady state, i.e., the voltage of the second battery 22 does not change anymore. At this moment, the third obtaining device 15 can measure the second steady open-circuit voltage to obtain that the second steady open-circuit voltage is 4360 mV. After the second steady open-circuit voltage is obtained, the third obtaining device 15 can further obtain that the second steady absolute state of charge is 96.682% according to the second steady open-circuit voltage by looking up Table 1 and the relation shown in FIG. 3 with interpolation. However, the present invention is not limited to this embodiment. The charging voltage of the second battery in the second constant voltage charging mode can be different from the charging voltage of the first battery in the first constant voltage charging mode. For example, in another embodiment, the charging voltage of the second battery in the second constant voltage charging mode can be 4.3 V, and the second steady absolute state of charge can be obtained according to the second steady open-circuit voltage, the corresponding first steady open-circuit voltages and the corresponding first steady states of charge of the first battery in the first constant voltage charging modes of 4.4 V and 4.2 V by interpolation.

TABLE 2

| Charging voltage of second battery (V) | Charging current of second battery (mA) | Second steady open-circuit voltage of second battery (mV) |
|---|---|---|
| 4.4 | 344 | 4360 |

Furthermore, in steps S6A and S7A, the fourth obtaining device 16 can obtain the corresponding one of the plurality of first steady absolute states of charge of the first battery 21 corresponding to the stop-charge parameter of the second battery 22 according to the stop-charge parameter of the second battery 22, and the aging level determining device 17 can determine the aging level of the second battery 22 relative to the first battery 21 according to the second steady absolute state of charge of the second battery 22 and the corresponding one of the plurality of first steady absolute states of charge of the first battery 21 corresponding to the stop-charge parameter of the second battery 22.

Specifically, in this embodiment, since the stop-charge parameter of the second battery 22 can be 344 mA, the fourth obtaining device 16 can obtain that the corresponding first steady open-circuit voltage and the corresponding first steady absolute state of charge of the first battery 21 corresponding to the stop-charge parameter of the second battery 22 can respectively be 4399.444 mV and 99.95% according to the stop-charge parameter of the second battery 22 by looking up Table 1 and the relation shown in FIG. 3 with interpolation. Thereby, the aging level determining device 17 can determine that the aging level of the second battery 22 relative to the first battery 21 can be 83.652% by introducing the second steady absolute state of charge of the second battery 22, the corresponding first steady open-circuit voltage of the first battery 21 corresponding to the stop-charge parameter of the second battery 22 and a first aging level of the first battery 21 into a following equation 1.

$$SoH_2 = SoH_1 - \frac{ASoC_1 - ASoC_2}{ASoC_1} * K \qquad \text{Equation 1}$$

In aforementioned Equation 1, $SoH_2$ is a second aging level of the second battery 22. $SoH_1$ is the first aging level of the first battery 21. $ASoC_1$ is the first steady absolute state of charge of the first battery 21 corresponding to the stop-charge parameter of the second battery 22. $ASoC_2$ is the second steady absolute state of charge of the second battery 22. K is a constant which is related to a chemistry of a battery and definition of SoH and can be obtained in advance by two batteries which have the same chemistry and known aging levels. In this embodiment, since the first battery 21 can be brand new, $SoH_1$ can be 100%, and K is 5. However, the present invention is not limited to this embodiment. In another embodiment, the first battery also can be used and not brand new, i.e., $SoH_1$ can be not equal to 100%. It depends on the practical first aging level of the first battery.

Figure 4:
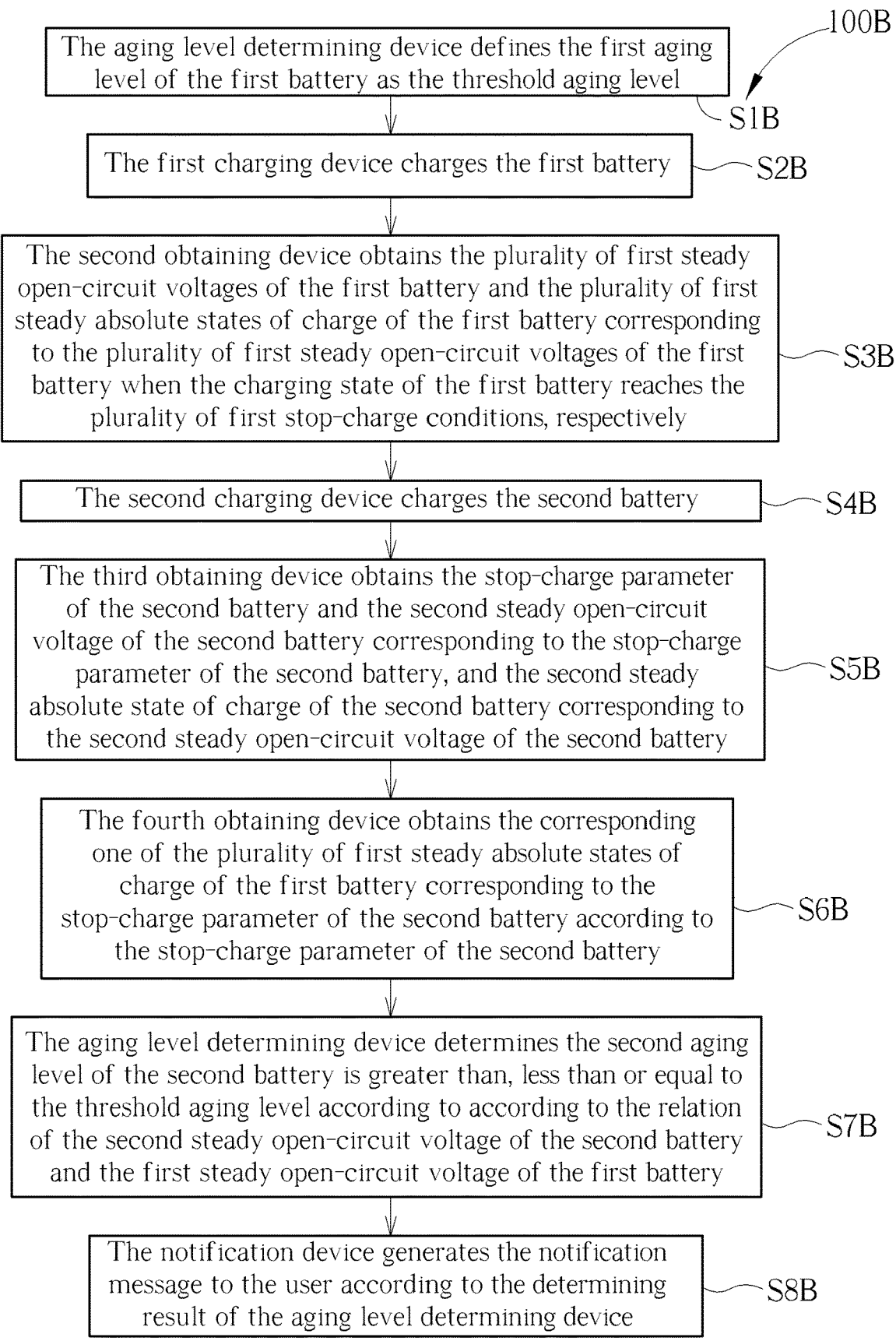
FIG. 4 is a flow chart diagram of a method of determining an aging level of a battery executed by a battery diagnosing system according to another embodiment of the present invention.

Please further refer to FIG. 4. FIG. 4 is a flow chart diagram of a method 100B of determining an aging level of a battery executed by a battery diagnosing system according to another embodiment of the present invention. As shown in FIG. 4, in this embodiment, when the first battery is not brand new and the first aging level of the first battery is known, the known first aging level of the first battery can be defined as a threshold aging level (step S1B). If it is desired to recognize whether the second aging level of the second battery is greater than the threshold aging level, a user can obtain the first steady open-circuit voltages of the first battery in the first constant voltage charging mode corresponding to the different stop-charge currents and further obtain the second steady open-circuit voltage of the second battery in the second constant voltage charging mode corresponding to the stop-charge parameter and the first steady open-circuit voltage of the first battery corresponding to the stop-charge parameter of the second battery, so as to compare them. Operation of obtaining the first steady open-circuit voltages of the first battery in the first constant voltage charging mode corresponding to the different stop-charge currents and obtaining the second steady open-circuit voltage of the second battery in the second constant voltage charging mode corresponding to the stop-charge parameter and the first steady open-circuit voltage of the first battery corresponding to the stop-charge parameter of the second battery described in steps S2B-S6B is similar to the one of the first embodiment. Detailed description is omitted herein for simplicity. When the second steady open-circuit voltage is less than the first steady open-circuit voltage, the aging level determining device can determine that the second aging level of the second battery is greater than the threshold aging level. When the second steady open-circuit voltage is greater than the first steady open-circuit voltage, the aging level determining device can determine that the second aging level of the second battery is less than the threshold aging level. When the second steady open-circuit voltage is equal to the first steady open-circuit voltage, the aging level determining device can determine that the second aging level of the second battery is equal to the threshold aging level (step S7B). Besides, the battery diagnosing system of this embodiment can further include a notification device, such as a light emitting component or a speaker. The notification device can generate a notification message to the user according to a determining result of the aging level determining device, i.e., a relation of the second aging level of the second battery and the threshold aging level, which facilities the user to take a countermeasure (step S8B). For example, the notification device can generate the notification message to the user for reminding the user to replace the second battery when the aging level determining device determines that the second aging level of the second battery is less than or equal to the threshold aging level. In other words, in this embodiment, it is not required to obtain the first steady absolute state of charge and the second steady absolute state of charge. However, the present invention is not limited to this embodiment. It depends on practical demands. For example, in another embodiment, the first steady absolute state of charge and the second steady absolute state of charge still can be obtained.

For example, the first steady open-circuit voltages of the first battery which has the known first aging level of 89.517% can be shown in following Table 3. When the charging voltage and stop-charge current of the second battery in the second constant voltage charging mode are respectively 4400 mV and 344 mA, the system can obtain that the corresponding second open-circuit voltage of the second battery and the corresponding first open-circuit voltage of the first battery are respectively 4360 mV and 4378.444 mV. At this moment, since the second steady open-circuit voltage is less than the first steady open-circuit voltage, the aging level determining device can determine that the second aging level of the second battery is greater than the threshold aging level, which is 89.517%, i.e., the second aging level of the second battery is greater than the first aging level of the first battery. Accordingly, the notification device can generate the notification message to remind the user to replace the second battery.

TABLE 3

| Charging voltage of first battery (V) | Charging current of first battery (mA) | First steady open-circuit voltage of first battery (mV) |
|---|---|---|
| 4.4 | 1000 | 4330 |
| 4.4 | 900 | 4337 |
| 4.4 | 800 | 4344 |
| 4.4 | 700 | 4352 |
| 4.4 | 600 | 4358 |
| 4.4 | 500 | 4366 |
| 4.4 | 400 | 4374 |
| 4.4 | 337 | 4379 |

Figure 5:
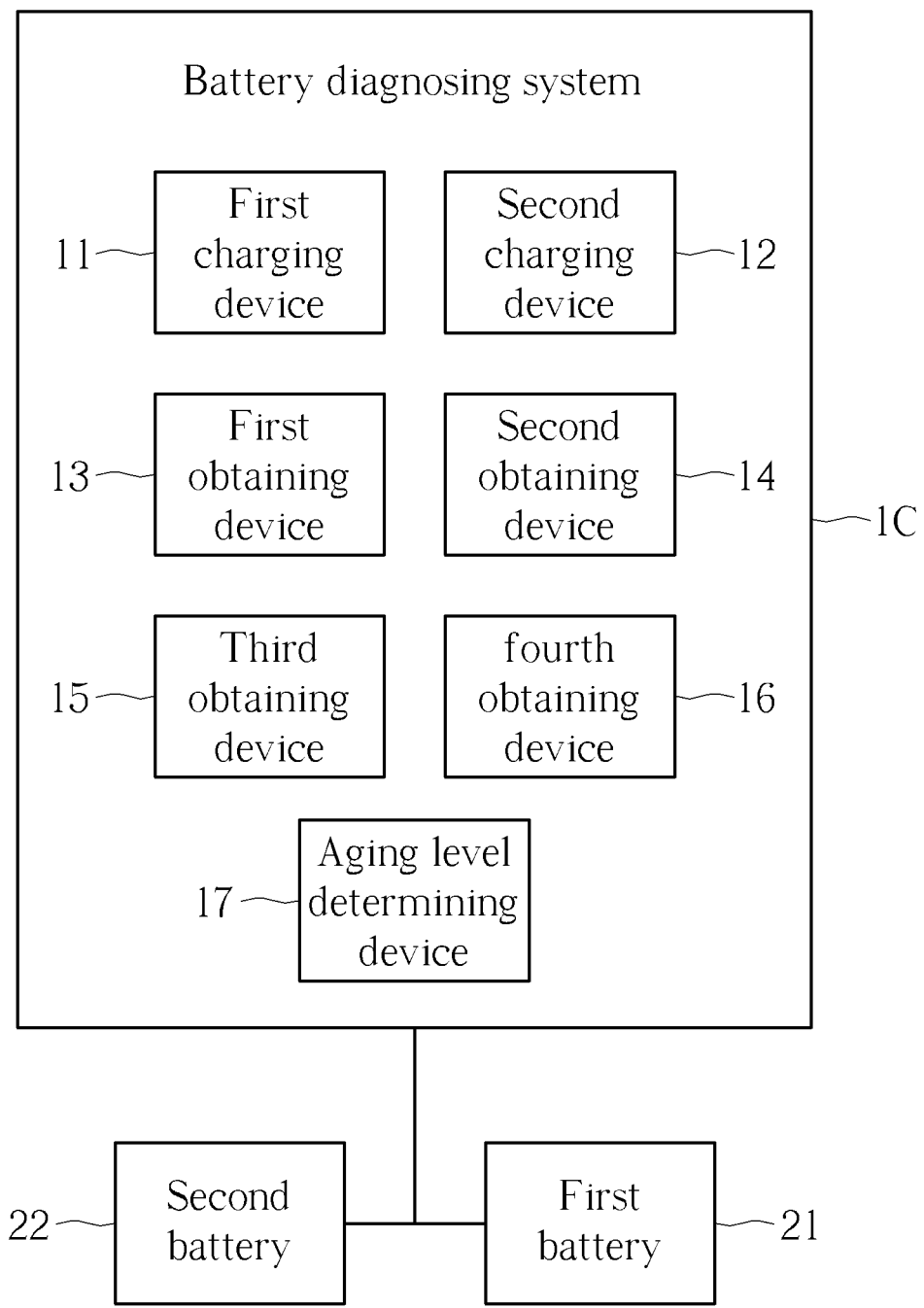
FIG. 5 is a functional block diagram of a battery diagnosing system according to a second embodiment of the present invention.
Figure 6:
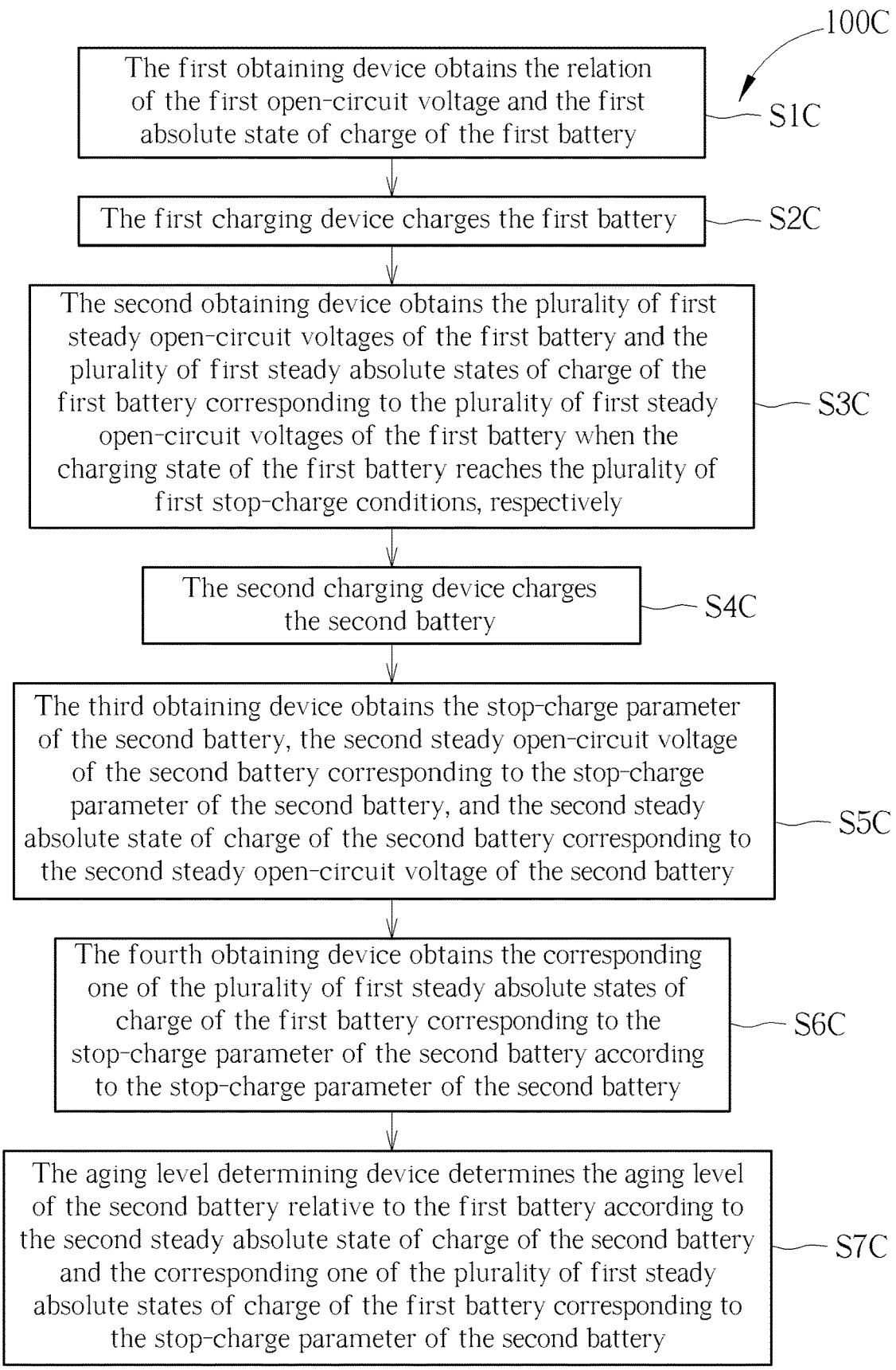
FIG. 6 is a flow chart diagram of a method of determining an aging level of a battery executed by the battery diagnosing system according to the second embodiment of the present invention.
Figure 7:
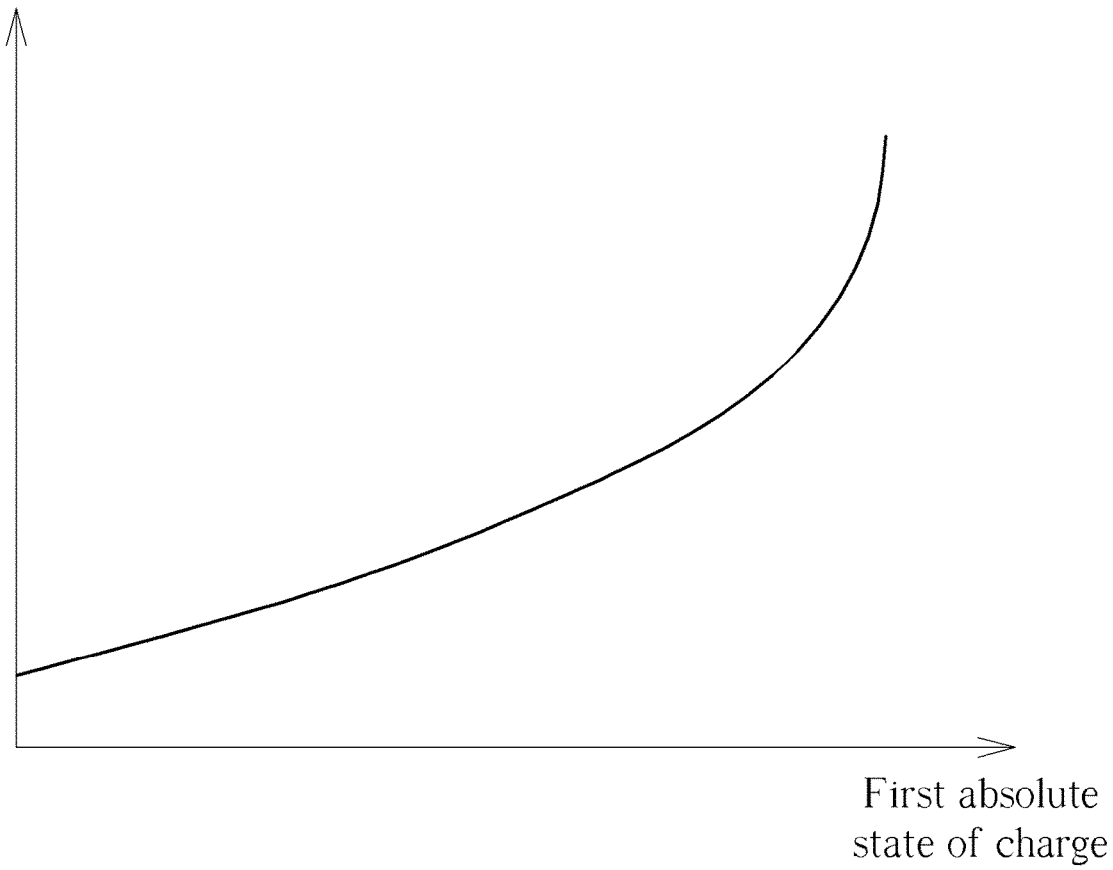
FIG. 7 is a diagram illustrating a relation of a first open-circuit voltage and a first absolute state of charge of a first battery according to the second embodiment of the present invention.

Please further refer to FIG. 5 to FIG. 7. FIG. 5 is a functional block diagram of a battery diagnosing system 1C according to a second embodiment of the present invention. FIG. 6 is a flow chart diagram of a method 100C of determining an aging level of a battery executed by the battery diagnosing system 1C according to the second embodiment of the present invention. FIG. 7 is a diagram illustrating a relation of a first open-circuit voltage and a first absolute state of charge of the first battery 21 according to the second embodiment of the present invention. As shown in FIG. 5 and FIG. 6, the battery diagnosing system 1C includes the first charging device 11, the second charging device 12, the first obtaining device 13, the second obtaining device 14, the third obtaining device 15, the fourth obtaining device 16 and the aging level determining device 17. Different from the first embodiment, in the second embodiment, the first charging device 11 stops charging the first battery 21 when the first battery 21 is in a first constant current charging mode, and the second charging device 12 stops charging the second battery 22 when the second battery 22 is in a second constant current charging mode.

In detail, in steps S1C-S3C, as shown in following Table 4, after the first obtaining device 13 obtains the relation of the first open-circuit voltage and the first absolute state of charge, the first charging device 11 can begin charging the first battery 21. The plurality of first stop-charge conditions can be a plurality of first stop-charge voltages of the first battery 21 in the first constant current charging mode. In this embodiment, the charging current of the first battery 21 in the first constant current charging mode can be 3000 mA, and the plurality of first stop-charge voltages can correspond to 3800, 3900, 4000, 4100, 4200 and 4300 mV. More specifically, when the charging current of the first battery 21 in the first constant current charging mode increases to 3800 mV along with increase of charging time, the first charging device 11 stops charging the first battery 21. Afterwards, the first battery 21 can stand for a while to be in the first steady state, i.e., the voltage of the first battery 21 does not change anymore. At this moment, the second obtaining device 14 can measure the corresponding first steady open-circuit voltage corresponding to the first stop-charge condition of 3800 mV to obtain that the corresponding first steady open-circuit voltage corresponding to the first stop-charge condition of 3800 mV is 3685 mV. Similarly, the first charging device 11 can stop charging the first battery 21 when the charging voltage of the first battery 21 reaches 3900, 4000, 4100, 4200 and 4300 mV respectively, so that the second obtaining device 14 can measure the corresponding first steady open-circuit voltages corresponding to the first stop-charge conditions of 3900, 4000, 4100, 4200 and 4300 mV to obtain that the corresponding first steady open-circuit voltages corresponding to the first stop-charge conditions of 3900, 4000, 4100, 4200 and 4300 mV are 3728, 3830, 3930, 4050 and 4146 mV respectively. After obtaining the first steady open-circuit voltages, the second obtaining device 14 can further obtain that the first steady absolute states of charge can be 5.618, 14.806, 40.567, 56.963, 69.004 and 78.053% according to the first steady open-circuit voltages by looking up the relation of the first open-circuit voltage and the first absolute state of charge, which is shown in FIG. 7, with interpolation.

TABLE 4

| Charging current of first battery (mA) | Charging voltage of first battery (mV) | First steady open-circuit voltage of first battery (mV) | First steady absolute state of charge of first battery Charging voltage of first battery (%) |
|---|---|---|---|
| 3000 | 3800 | 3685 | 5.618 |
| 3000 | 3900 | 3728 | 14.806 |
| 3000 | 4000 | 3830 | 40.567 |
| 3000 | 4100 | 3930 | 56.963 |
| 3000 | 4200 | 4050 | 69.004 |
| 3000 | 4300 | 4146 | 78.053 |

Furthermore, in step S5C, as shown in following Table 5, the second charging device 12 can stop charging the second battery 22 after the second charging device 12 charges the second battery 22 to make the second battery in the second constant current charging mode. Preferably, in this embodiment, the charging currents of the second battery 22 and the first battery 21 can be the same and equal to 3000 mA. At this moment, the third obtaining device 15 can measure the charging voltage of the second battery 22 just before stopping charging second battery 22, i.e., the stop-charge voltage of the second battery 22, to obtain that the stop-charge voltage is 4050 mV. In other words, in this embodiment, the stop-charge parameter can be a stop-charge voltage of the second battery 22 in the second constant current charging mode. Afterwards, the second battery 22 can stand for a while to be in a second steady state, i.e., the voltage of the second battery 22 does not change anymore. At this moment, the third obtaining device 15 can measure the second steady open-circuit voltage to obtain that the second steady open-circuit voltage is 3870 mA. Then, the third obtaining device 15 can further obtain that the second steady absolute state of charge is 48.721% according to the second steady open-circuit voltage, by looking up Table 4 and the relation shown in FIG. 7 with interpolation. However, the present invention is not limited to this embodiment. The charging currents of the second battery in the second constant current charging mode and the first battery in the first constant current charging mode can be different. For example, in another embodiment, the charging current of the second battery in the second constant current charging mode can be 2900 mA, and the second steady absolute state of charge can be obtained according to the second steady open-circuit voltage and the corresponding first steady open-circuit voltages and the corresponding first steady absolute states of charge of the first battery in the first constant current charging modes of 3000 mA and 2800 mA by interpolation.

TABLE 5

| Charging current of second battery (mA) | Charging voltage of second battery (mV) | Second steady open-circuit voltage (mV) |
|---|---|---|
| 3000 | 4050 | 3870 |

Afterwards, in steps S6C and S7C, the fourth obtaining device 16 can obtain that the corresponding first steady open-circuit voltage and the corresponding first steady absolute state of charge of the first battery 21 corresponding to the stop-charge parameter of the second battery 22 are 3880 mV and 50.435% respectively. Thereby, the aging level determining device 17 can obtain that the second aging level of the second battery 22 relative to the first battery 21 is 83.008% by introducing the second steady absolute state of charge of the second battery 22 and the first steady absolute state of charge and the first aging level of the first battery 21 corresponding to the stop-charge parameter of the second battery 22 into following Equation 2.

$$SoH_2 = SoH_1 - \frac{ASoC_1 - ASoC_2}{ASoC_1} * K \qquad \text{Equation 2}$$

In aforementioned Equation 2, $SoH_2$ is the second aging level of the second battery 22. $SoH_1$ is the first aging level of the first battery 21. $ASoC_1$ is the first steady absolute state of charge of the first battery 21 corresponding to the stop-charge parameter of the second battery 22. $ASoC_2$ is the second steady absolute state of charge of the second battery 22. K is a constant. In this embodiment, the first battery 21 can be brand new and has chemistry which is the same as the one of the first embodiment, i.e., $SoH_1$ can be 100%, and K can be equal to 5. However, the present invention is not limited to this embodiment. For example, in another embodiment, the first battery can be used and not brand new, i.e., $SoH_1$ can be not equal to 100%. It depends on the practical first aging level of the first battery.

Besides, in another embodiment, when the first battery is not brand new and the first aging level of the first battery is known, the known first aging level of the first battery can be defined as the threshold aging level. When it is desired to recognize whether the second aging level of the second battery is greater than the threshold aging level, the system can obtain the first steady open-circuit voltages of the first battery in the first constant current charging mode corresponding to different stop-charge currents and obtain the second steady open-circuit voltage of the second battery in the second constant current charging mode corresponding to the stop-charge parameter and the first steady open-circuit voltage of the first battery corresponding to the stop-charge parameter of the second battery, so as to compare them. Operation of obtaining the first steady open-circuit voltages of the first battery in the first constant current charging mode corresponding to the different stop-charge currents, obtaining the second steady open-circuit voltage of the second battery in the second constant current charging mode corresponding to the stop-charge parameter and obtaining the first steady open-circuit voltage of the first battery corresponding to the stop-charge parameter of the second battery are similar to the ones of the aforementioned embodiments. Detailed description is omitted herein for simplicity. When the second steady open-circuit voltage is less than the first steady open-circuit voltage, the aging level determining device can determine the second aging level of the second battery is greater than the threshold aging level. When the second steady open-circuit voltage is greater than the first steady open-circuit voltage, the aging level determining device can determine that the second aging level of the second battery is less than the threshold aging level. When the second steady open-circuit voltage is equal to the first steady open-circuit voltage, the aging level determining device can determine that the second aging level of the second battery is equal to the threshold aging level. Besides, the battery diagnosing system of this embodiment can further include the notification device, such as the light emitting component or the speaker. The notification device can generate the notification message to the user according to the determining result of the aging level determining device, i.e., the relation of the second aging level of the second battery and the threshold aging level, which facilities the user to take the countermeasure (step S8B). For example, the notification device can generate the notification message to the user for reminding the user to replace the second battery when the aging level determining device determines that the second aging level of the second battery is less than or equal to the threshold aging level. In other words, in this embodiment, it is not required to obtain the first steady absolute state of charge and the second steady absolute state of charge. However, the present invention is not limited to this embodiment. It depends on practical demands. For example, in another embodiment, the first steady absolute state of charge and the second steady absolute state of charge still can be obtained.

For example, the first steady open-circuit voltages of the first battery which has a known aging level of 83.003% can be shown in following Table 6. When the charging current and stop-charge voltage of the second battery in the second constant current charging mode are respectively 3000 mA and 4050 mV, the system can obtain that the corresponding second open-circuit voltage of the second battery and the corresponding first open-circuit voltage of the first battery are respectively 3875 mV and 3870.5 mV. At this moment, since the second steady open-circuit voltage is less than the first steady open-circuit voltage, the aging level determining device can determine that the second aging level of the second battery is greater than the threshold aging level, which is 83.003%, i.e., the second aging level of the second battery is greater than the first aging level of the first battery. Accordingly, the notification device can generate the notification message to remind the user to replace the second battery.

TABLE 6

| Charging current of first battery (mA) | Charging voltage of first battery (mV) | First steady open-circuit voltage of first battery (mV) |
| --- | --- | --- |
| 3000 | 3800 | 3675 |
| 3000 | 3900 | 3718 |
| 3000 | 4000 | 3821 |
| 3000 | 4100 | 3920 |
| 3000 | 4200 | 4040 |
| 3000 | 4300 | 4136 |

The battery diagnosing systems of the above-described embodiments of the present invention can be implemented in software, firmware, hardware configuration, or combination thereof, and the first charging device, the second charging device, the first obtaining device, the second obtaining device, the third obtaining device, the fourth obtaining device and the aging level determining device also can be implemented in software, firmware, hardware configuration, or combination thereof. For example, the battery diagnosing system can be a computer system including a processor and a non-transitory computer readable storage medium storing programs, each charging device can be a computer device including a charger, a processor and a non-transitory computer readable storage medium storing programs, each obtaining device can be a computer device including a digital multi-meter, a processor and a non-transitory computer readable storage medium storing programs, and the aging level determining device can be a computer device including a processor and a non-transitory computer readable storage medium storing programs. Each processor can execute the corresponding programs to achieve the aforementioned functions. The processor can be a central processing unit (CPU), an application processor, a microprocessor, etc., or can be realized by an application specific integrated circuit (ASIC). The non-transitory computer-readable storage medium can be a Read-Only Memory (ROM), a random-access memory (RAM), a CD-ROM, a magnetic tape, a floppy disk, or an optical data storage device. However, the present invention is not limited thereto. Any two devices can be integrated together. For example, the first charging device and the second charging device can be integrated into one charging device.

In contrast to the prior art, in the present invention, when it is desired to determine the second aging level of the second battery relative to the first battery, it can obtain the plurality of first steady open-circuit voltages of the first battery when the charging state of the first battery reaches a plurality of first stop-charge conditions respectively and then can obtain a stop-charge parameter of the second battery and a second steady open-circuit voltage of the second battery corresponding to the stop-charge parameter of the second battery. Afterwards, the second aging level of the second battery relative to the first battery can be determined according to the second steady open-circuit voltage of the second battery and the one of the plurality of first steady open-circuit voltages of the first battery corresponding to the stop-charge parameter of the second battery. The present invention requires neither draining of a battery nor a relation of an internal resistance and an aging level of the battery. Therefore, the method of determining an aging level of a battery of the present invention consumes less time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of determining an aging level of a battery, the method comprising:
utilizing a first charging device to charge a first battery;
utilizing a second obtaining device to obtain a plurality of first steady open-circuit voltages of the first battery when a charging state of the first battery respectively reaches a plurality of first stop-charge conditions;
utilizing a second charging device to charge a second battery;

utilizing a third obtaining device to obtain a stop-charge parameter of the second battery and a second steady open-circuit voltage of the second battery corresponding to the stop-charge parameter of the second battery; and utilizing an aging level determining device to determine an aging level of the second battery relative to the first battery according to the second steady open-circuit voltage of the second battery and one of the plurality of first steady open-circuit voltages of the first battery corresponding to the stop-charge parameter of the second battery, wherein the aging level determining device determines the aging level of the second battery relative to the first battery by comparing the second steady open-circuit voltage of the second battery with the one of the plurality of first steady open-circuit voltages of the first battery corresponding to the stop-charge parameter of the second battery.

2. The method of claim 1, wherein utilizing the second obtaining device to obtain the plurality of first steady open-circuit voltages of the first battery when the charging state of the first battery respectively reaches the plurality of first stop-charge conditions:

stopping the first charging device from charging the first battery when the charging state of the first battery reaches one of the plurality of first stop-charge conditions; and utilizing the second obtaining device to measure one of the plurality of first steady open-circuit voltages corresponding to the one of the plurality of first stop-charge conditions when the first battery is in a first steady state.

3. The method of claim 1, wherein utilizing the third obtaining device to obtain the stop-charge parameter of the second battery and the second steady open-circuit voltage of the second battery corresponding to the stop-charge parameter of the second battery comprising:

stopping the second charging device from charging the second battery and utilizing the third obtaining device to measure the stop-charge parameter of the second battery after the second battery is charged for a predetermined period of time; and utilizing the third obtaining device to measure the second steady open-circuit voltage of the second battery when the second battery is in a second steady state.

4. The method of claim 1, further comprising:

utilizing the second obtaining device to obtain a plurality of first steady absolute states of charge of the first battery corresponding to the plurality of first steady open-circuit voltages of the first battery when the charging state of the first battery respectively reaches the plurality of first stop-charge conditions;

utilizing the third obtaining device to obtain a second steady absolute state of charge of the second battery corresponding to the second steady open-circuit voltage of the second battery;

utilizing a fourth obtaining device to obtain one of the plurality of first steady absolute states of charge of the first battery corresponding to the stop-charge parameter of the second battery according to the stop-charge parameter of the second battery; and utilizing the aging level determining device to determine the aging level of the second battery relative to the first battery according to the second steady absolute state of charge of the second battery corresponding to the second steady open-circuit voltage of the second battery and the one of the plurality of first steady absolute states of charge of the first battery corresponding to the stop-charge parameter of the second battery.

5. The method of claim 4, further comprising:

utilizing a first obtaining device to obtain a relation of a first open-circuit voltage and a first absolute state of charge of the first battery before utilizing the first charging device to charge the first battery;

utilizing the second obtaining device to obtain the plurality of first steady absolute states of charge of the first battery according to the plurality of first steady open-circuit voltages and the relation of the first open-circuit voltage and the first absolute state of charge of the first battery;

utilizing the third obtaining device to obtain the second steady absolute state of charge of the second battery corresponding to the second steady open-circuit voltage of the second battery according to the second steady open-circuit voltage and the relation of the first open-circuit voltage and the first absolute state of charge of the first battery; and utilizing the fourth obtaining device to obtain the one of the plurality of the first steady absolute states of charge of the first battery corresponding to the stop-charge parameter of the second battery according to the stop-charge parameter of the second battery and the relation of the first open-circuit voltage and the first absolute state of charge of the first battery.

6. The method of claim 1, wherein the plurality of first stop-charge conditions respectively correspond to a plurality of first stop-charge currents of the first battery in a first constant voltage charging mode, and the stop-charge parameter is a stop-charge current of the second battery in a second constant voltage charging mode.

7. The method of claim 1, wherein the plurality of first stop-charge conditions respectively correspond to a plurality of first stop-charge voltages of the first battery in a first constant current charging mode, and the stop-charge parameter is a second stop-charge voltage of the second battery in a second constant current charging mode.

8. The method of claim 1, further comprising:

utilizing the aging level determining device to define a first aging level of the first battery as a threshold aging level; and utilizing the aging level determining device to determine a second aging level of the second battery is greater than, less than or equal to the threshold aging level according to a relation of the second steady open-circuit voltage of the second battery and the one of the plurality of first steady open-circuit voltages of the first battery corresponding to the stop-charge parameter.

9. The method of claim 8, wherein utilizing the aging level determining device to determine the second aging level of the second battery is greater than, less than or equal to the threshold aging level according to the relation of the second steady open-circuit voltage of the second battery and the one of the plurality of first steady open-circuit voltages of the first battery corresponding to the stop-charge parameter comprising:

utilizing the aging level determining device to determine the second aging level is less than the threshold aging level when the second steady open-circuit voltage is greater than the one of the plurality of first steady open-circuit voltages of the first battery corresponding to the stop-charge parameter.

10. The method of claim 8, wherein utilizing the aging level determining device to determine the second aging level of the second battery is greater than, less than or equal to the threshold aging level according to the relation of the second steady open-circuit voltage of the second battery and the one of the plurality of first steady open-circuit voltages of the first battery corresponding to the stop-charge parameter comprising:

utilizing the aging level determining device to determine the second aging level is equal to the threshold aging level when the second steady open-circuit voltage is equal to the one of the plurality of first steady open-circuit voltages of the first battery corresponding to the stop-charge parameter.

11. The method of claim 8, wherein utilizing the aging level determining device to determine the second aging level of the second battery is greater than, less than or equal to the threshold aging level according to the relation of the second steady open-circuit voltage of the second battery and the one of the plurality of first steady open-circuit voltages of the first battery corresponding to the stop-charge parameter comprising:

utilizing the aging level determining device to determine the second aging level is greater than the threshold aging level when the second steady open-circuit voltage is less than the one of the plurality of first steady open-circuit voltages of the first battery corresponding to the stop-charge parameter.

12. The method of claim 8, further comprising:

utilizing a notification device to generate a notification message according to a determining result of the aging level determining device.

\* \* \* \* \*